(12) United States Patent
Goshi

(10) Patent No.: US 11,446,588 B2
(45) Date of Patent: Sep. 20, 2022

(54) SUBSTRATE PROCESSING APPARATUS AND SUBSTRATE PROCESSING METHOD

(71) Applicant: Tokyo Electron Limited, Tokyo (JP)

(72) Inventor: Gentaro Goshi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 177 days.

(21) Appl. No.: 16/782,419

(22) Filed: Feb. 5, 2020

(65) Prior Publication Data

US 2020/0246723 A1   Aug. 6, 2020

(30) Foreign Application Priority Data

Feb. 6, 2019   (JP) .............................. JP2019-019920

(51) Int. Cl.
*B05C 11/10* (2006.01)
*B01D 11/04* (2006.01)

(52) U.S. Cl.
CPC ...... *B01D 11/0411* (2013.01); *B05C 11/1013* (2013.01)

(58) Field of Classification Search
None
See application file for complete search history.

(56) References Cited

U.S. PATENT DOCUMENTS

| | | | | |
|---|---|---|---|---|
| 7,380,984 B2* | 6/2008 | Wuester | ................... | G01K 1/08 374/141 |
| 2005/0191865 A1* | 9/2005 | Jacobson | .......... | H01L 21/31133 438/780 |
| 2006/0003592 A1* | 1/2006 | Gale | ................. | H01L 21/31111 438/745 |
| 2006/0073041 A1* | 4/2006 | Goshi | ................... | F04D 29/061 417/423.7 |
| 2006/0185693 A1* | 8/2006 | Brown | .................. | B08B 7/0021 134/26 |
| 2006/0219268 A1* | 10/2006 | Jacobson | ............... | C11D 7/265 134/26 |
| 2006/0225769 A1* | 10/2006 | Goshi | .............. | H01L 21/67248 134/10 |

(Continued)

FOREIGN PATENT DOCUMENTS

JP          2014-101241 A          6/2014

*Primary Examiner* — Jethro M. Pence
(74) *Attorney, Agent, or Firm* — Pearne & Gordon LLP

(57) ABSTRACT

A substrate processing apparatus includes a supercritical fluid producing apparatus including a pump configured to send out a processing fluid; a processing container configured to perform a supercritical fluid processing on a substrate with a processing fluid in a supercritical state sent from the supercritical fluid producing apparatus; and a controller configured to control at least the supercritical fluid producing apparatus. When a pressure increase is performed within the processing container by using the processing fluid, the controller determines a first supply rate at which the processing fluid is supplied to the processing container based on a target time during which the pressure increase is performed, an amount of the processing fluid required for the pressure increase and a density of the processing fluid. Further, the supercritical fluid producing apparatus supplies the processing fluid to the processing container based on the first supply rate.

17 Claims, 6 Drawing Sheets

(56) References Cited

U.S. PATENT DOCUMENTS

| | | | |
|---|---|---|---|
| 2006/0225772 A1* | 10/2006 | Jones | B08B 7/0021 |
| | | | 134/56 R |
| 2006/0226117 A1* | 10/2006 | Bertram | H01L 21/02101 |
| | | | 216/59 |
| 2007/0169794 A1* | 7/2007 | Han | H01L 21/02071 |
| | | | 134/94.1 |
| 2017/0008040 A1* | 1/2017 | Jeong | H01L 21/67017 |
| 2017/0076938 A1* | 3/2017 | Mitsuoka | H01L 21/02101 |
| 2017/0256397 A1* | 9/2017 | Goshi | H01L 21/67028 |
| 2018/0028936 A1* | 2/2018 | Oh | H01L 21/67109 |
| 2018/0366348 A1* | 12/2018 | Cho | H01L 21/67248 |

\* cited by examiner

SUBSTRATE PROCESSING APPARATUS AND SUBSTRATE PROCESSING METHOD

CROSS-REFERENCE TO RELATED APPLICATION

This application claims the benefit of Japanese Patent Application No. 2019-019920 filed on Feb. 6, 2019, the entire disclosure of which is incorporated herein by reference.

TECHNICAL FIELD

The exemplary embodiments described herein pertain generally to a substrate processing apparatus and a substrate processing method.

BACKGROUND

In a manufacturing process of a semiconductor device in which a stacked structure of an integrated circuit is formed on the surface of a substrate such as a semiconductor wafer (hereinafter, referred to as a "wafer"), a liquid processing such as chemical liquid cleaning or wet etching is performed. When a liquid remaining on the surface of the wafer is removed by the liquid processing, a drying method using a processing fluid in a supercritical state has been recently performed (see, for example, Patent Document 1).

Patent Document 1: Japanese Patent Laid-open Publication No. 2014-101241

SUMMARY

In one exemplary embodiment, a substrate processing apparatus includes a supercritical fluid producing apparatus including a pump configured to send out a processing fluid; a processing container configured to perform a supercritical fluid processing on a substrate with a processing fluid in a supercritical state sent from the supercritical fluid producing apparatus; and a controller configured to control at least the supercritical fluid producing apparatus. When a pressure increase is performed within the processing container by using the processing fluid, the controller determines a first supply rate at which the processing fluid is supplied to the processing container based on a target time during which the pressure increase is performed, an amount of the processing fluid required for the pressure increase and a density of the processing fluid. Further, the supercritical fluid producing apparatus supplies the processing fluid to the processing container based on the first supply rate.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

DETAILED DESCRIPTION

Figure 1:
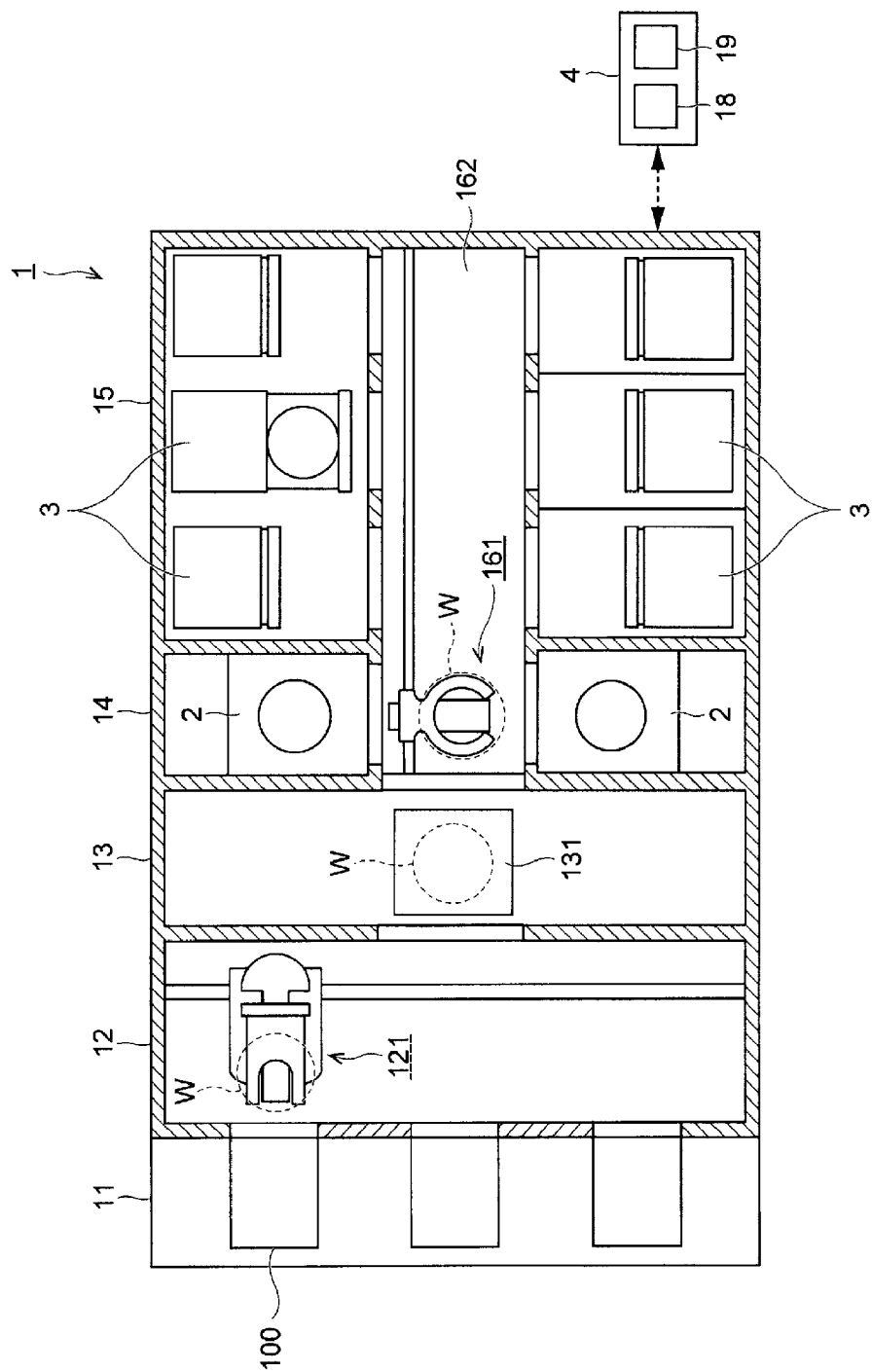
FIG. 1 is a transverse plan view illustrating an entire configuration of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described with reference to the accompanying drawings. Meanwhile, the configuration illustrated in the drawings attached to the present specification may include portions in which, for example, sizes and scales are changed from those of actual ones for convenience of illustration and ease of understanding.

[Configuration of Substrate Processing System]

FIG. 1 is a transverse plan view illustrating an entire configuration of a substrate processing system 1.

The substrate processing system 1 includes a plurality of cleaning devices 2 (two cleaning devices 2 in the example illustrated in FIG. 1) and a plurality of supercritical processing apparatuses 3 (two supercritical processing apparatuses 3 in the example illustrated in FIG. 1). The cleaning device 2 is configured to perform a cleaning processing by supplying a cleaning liquid to a wafer W. The supercritical processing apparatus 3 is configured to remove a dry-suppressing liquid (isopropyl alcohol (IPA) in the present exemplary embodiment) remaining on the wafer W after the cleaning processing by bringing the dry-suppressing liquid into contact with a processing fluid in a supercritical state (carbon dioxide ($CO_2$) in the present exemplary embodiment).

In the substrate processing system 1, a FOUP 100 is placed in a placing section 11, and wafers W stored in the FOUP 100 are delivered to a cleaning processing section 14 and a supercritical processing section 15 via a carry-in/out section 12 and a delivery section 13. In the cleaning processing section 14 and the supercritical processing section 15, the wafer W is first carried into the cleaning device 2 provided in the cleaning processing section 14, and subjected to the cleaning processing. Then, the wafer W is carried into the supercritical processing apparatus 3 provided in the supercritical processing section 15, and subjected to a drying processing in which the IPA is removed from the wafer W. In FIG. 1, a reference numeral "121" indicates a first transfer device configured to transfer the wafer W between the FOUP 100 and the delivery section 13, and a reference numeral "131" indicates a delivery shelf serving as a buffer in which the wafer W being transferred between the carry-in/out section 12, and the cleaning processing section 14 and the supercritical processing section 15 are temporarily placed.

A wafer transfer path 162 is connected to an opening of the delivery section 13, and the cleaning processing section 14 and the supercritical processing section 15 are provided along the wafer transfer path 162. In the cleaning processing section 14, a total of two cleaning devices 2 are provided, i.e., one cleaning device 2 at one side and one cleaning device 2 at the other side are arranged with the wafer transfer path 162 therebetween. Meanwhile, in the supercritical processing section 15, a total of two supercritical processing apparatuses 3 functioning as substrate processing apparatuses configured to perform a drying processing of removing IPA from the wafer W are provided, i.e., one supercritical processing apparatus 3 at one side and one supercritical processing apparatus 3 at the other side are arranged with the wafer transfer path 162 therebetween. A second transfer device 161 is placed in the wafer transfer path 162, and the second transfer device 161 is provided to be movable within the wafer transfer path 162. The wafer W placed on the delivery shelf 131 is received by the second transfer device 161, and the second transfer device 161 carries the wafer W into the cleaning device 2 and the supercritical processing apparatus 3. Further, the number and the placement of the cleaning devices 2 and the supercritical processing apparatuses 3 are not particularly limited, but an appropriate number of cleaning devices 2 and an appropriate number of supercritical processing apparatuses 3 are placed appropriately according to the number of wafers W processed per unit time and a processing time of each cleaning device 2 and each supercritical processing apparatus 3.

The cleaning device 2 is configured as, e.g., a single wafer-type device configured to clean the wafers W one by one by spin cleaning. In this case, while each wafer W is horizontally held and rotated around a vertical axis, a chemical liquid for cleaning or a rinse liquid for washing off the chemical liquid is supplied to a processing surface of the wafer W at an appropriate timing so that the cleaning process of the wafer W may be performed. The chemical liquid and the rinse liquid used in the cleaning device 2 are not particularly limited. For example, an SC1 solution (i.e., a mixed solution of ammonia and hydrogen peroxide water) which is an alkaline chemical liquid may be supplied to the wafer W to remove a particle or an organic contaminant from the wafer W. Then, deionized water (DIW) serving as a rinse liquid may be supplied to the wafer W to wash off the SC1 solution from the wafer W. A diluted hydrofluoric acid (DHF) aqueous solution which is an acidic chemical liquid may be supplied to the wafer W to remove a natural oxide film, and then, the DIW may be supplied to the wafer W to wash off the DHF aqueous solution from the wafer W.

Then, after the rinse processing using the DIW is completed, the cleaning device 2 supplies IPA as the dry-suppressing liquid to the wafer W while rotating the wafer W to replace the DIW remaining on the processing surface of the wafer W with the IPA. Then, the cleaning device 2 gently stops the rotation of the wafer W. Here, a sufficient amount of IPA is supplied to the wafer W, and the IPA is accumulated on the surface of the wafer W on which a semiconductor pattern is formed, so that a liquid film of IPA is formed on the surface of the wafer W. Then, the wafer W is carried out of the cleaning device 2 by the second transfer device 161 while the IPA is accumulated thereon.

The IPA applied to the surface of the wafer W as described above serves to suppress drying of the wafer W. The cleaning device 2 applies a sufficient amount of IPA to the wafer W so that the IPA film having a relatively large thickness can be formed on the surface of the wafer W. Thus, it is possible to suppress, particularly, a so-called pattern collapse caused by evaporation of the IPA from occurring on the wafer W while transferring the wafer W from the cleaning device 2 to the supercritical processing apparatus 3.

The wafer W carried out of the cleaning device 2 is carried into a processing container of the supercritical processing apparatus 3 by the second transfer device 161 while the IPA is accumulated. Then, a drying processing of IPA is performed in the supercritical processing apparatus 3.

Figure 3:
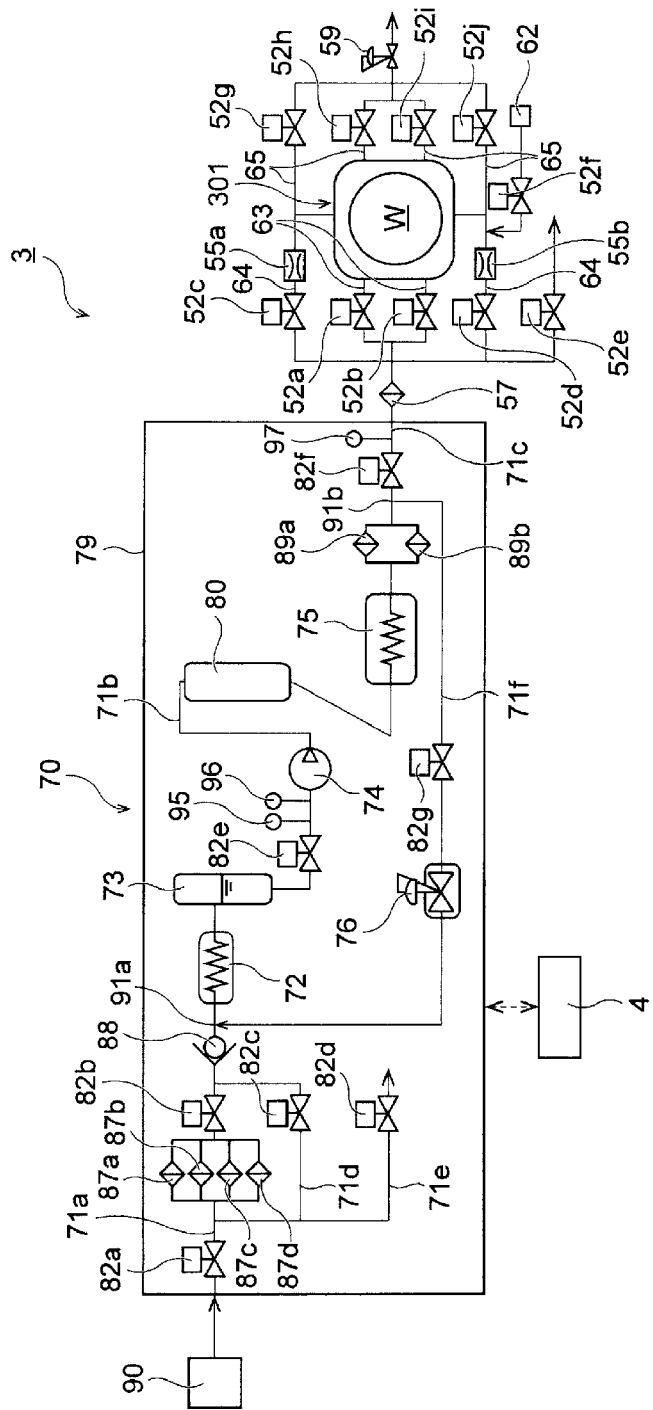
FIG. 3 illustrates a configuration example of an entire system of the supercritical processing apparatus.

A controller 4 controls the entire substrate processing system 1 including a supercritical fluid producing apparatus 70 illustrated in FIG. 3. The controller 4 is, e.g., a computer and includes a calculator 18 and a storage 19. The storage 19 stores a program that controls various processings to be executed in the substrate processing system 1. The calculator 18 controls an operation of the substrate processing system 1 by reading and executing the program stored in the storage 19. The program may be recorded in a computer-readable storage medium and then installed from the storage medium to the storage 19 of the controller 4. The computer-readable storage medium may be, e.g., a hard disk (HD), a flexible disk (FD), a compact disk (CD), a magneto-optical disk (MO), or a memory card. Otherwise, a controller that controls the entire substrate processing system 1 may be provided separately from a controller that controls the supercritical fluid producing apparatus 70.

[Supercritical Processing Apparatus]

Hereinafter, details of the drying processing performed in the supercritical processing apparatus 3 with a supercritical fluid will be described. First, an exemplary configuration of the processing container of the supercritical processing apparatus 3 into which the wafer W is carried will be described. Then, an exemplary configuration of the entire system of the supercritical processing apparatus 3 will be described.

Figure 2:
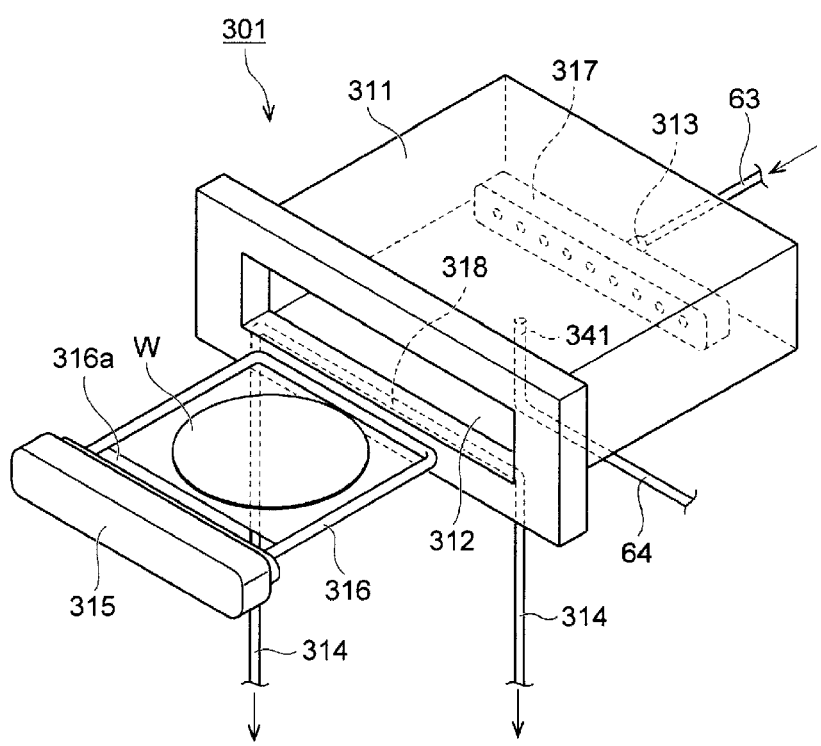
FIG. 2 is an exterior perspective view illustrating an example of a processing container of a supercritical processing apparatus.

FIG. 2 is an exterior perspective view illustrating an example of a processing container 301 of the supercritical processing apparatus 3.

The processing container 301 is configured to perform a supercritical fluid processing to the wafer W using a processing fluid in a supercritical state (supercritical fluid) supplied from the supercritical fluid producing apparatus 70. The processing container 301 is equipped with a housing-shaped container main body 311, a holding plate 316 configured to hold the wafer W as a processing target horizontally and a cover member 315 configured to support the holding plate 316. The container main body 311 is provided with an opening 312 through which the wafer W is carried in or out. The cover member 315 is configured to seal the opening 312 when the wafer W is carried into the container main body 311.

The container main body 311 is a vessel having therein a processing space in which a wafer W having a dimeter of, e.g., 300 mm can be accommodated. A fluid supply header (a first fluid supply) 317 is provided at one end side within the container main body 311 and a fluid discharge header (a fluid discharge unit) 318 is provided at the other end side within the container main body 311. In the illustrated example, the fluid supply header 317 is formed of a block body including a large number of openings (first fluid supply ports) and the fluid discharge header 318 is formed of a pipe including a large number of openings (fluid discharge ports). Desirably, the first fluid supply ports of the fluid supply header 317 may be located at a position slightly higher than an upper surface of the wafer W held by the holding plate 316.

The configuration of the fluid supply header 317 and the fluid discharge header 318 is not limited to the illustrated example, but, for example, the fluid discharge header 318 may be formed of the block body and the fluid supply header 317 may be formed of the pipe.

When viewed from below, the holding plate 316 covers almost an entire area of a lower surface of the wafer W. The holding plate 316 has an opening 316a at an end portion near the cover member 315. A processing fluid present in a space above the holding plate 316 is guided to the fluid discharge header 318 through the opening 316a.

The fluid supply header 317 supplies the processing fluid into the container main body 311 (processing chamber 301) in the substantially horizontal direction. Here, the horizontal direction refers to a direction perpendicular to the vertical direction in which the gravity acts and generally refers to a direction parallel with the direction in which the flat surface of the wafer W held by the holding plate 316 extends.

The fluid within the processing container 301 is discharged to the outside of the processing container 301 through the fluid discharge header 318. The fluid discharged through the fluid discharge header 318 contains not only the processing fluid supplied into the processing container 301 through the fluid supply header 317, but also the IPA adhering to the surface of the wafer W to be dissolved in the processing fluid.

A fluid supply nozzle (a second fluid supply) 341 is provided at a bottom portion of the container main body 311 to supply the processing fluid into the processing container 301. In the illustrated example, the fluid supply nozzle 341 is configured as an opening formed in a bottom wall of the container main body 311. The fluid supply nozzle 341 is located under (e.g., right under) the central portion of the wafer W and supplies the processing fluid into the processing container 301 toward the central portion of the wafer W (e.g., vertically upwards).

The processing container 301 further includes a non-illustrated pressing mechanism. The pressing mechanism serves to press the cover member 315 toward the container main body 311 against the internal pressure caused by the processing fluid in the supercritical state supplied into the processing space, thereby sealing the processing space. It is desirable to provide an insulating material or a tape heater (not illustrated) to the ceiling wall or the bottom wall of the container main body 311 such that the processing fluid supplied into the processing space is kept at a temperature of the supercritical state.

[Configuration of Entire System of Supercritical Processing Apparatus]

FIG. 3 illustrates a configuration example of the entire system of the supercritical processing apparatus 3.

As illustrated in FIG. 3, the supercritical processing apparatus 3 includes the supercritical fluid producing apparatus 70 according to the present exemplary embodiment and the processing container 301 in which the supercritical fluid processing is performed on the wafer W with the supercritical fluid supplied from the supercritical fluid producing apparatus 70. The processing container 301 is the same as described above (see FIG. 2).

The supercritical fluid producing apparatus 70 is provided at the upstream side of the processing container 301. The processing fluid (supercritical fluid) is supplied from the supercritical fluid producing apparatus 70 to a supply line for circulating the processing fluid in the supercritical processing apparatus 3. A filter 57 and opening/closing valves 52a and 52b are provided between the supercritical fluid producing apparatus 70 and the processing container 301 in this order from the upstream side toward the downstream side. In this description, the terms "upstream side" and "downstream side" are determined based on the flowing direction of the processing fluid in the supply line.

The filter 57 is configured to remove foreign substances contained in the processing fluid supplied from the supercritical fluid producing apparatus 70 and allow the clean processing fluid to be flown toward the downstream side. The opening/closing valves 52a and 52b are configured to regulate on and off of the supply of the processing fluid from the supercritical fluid producing apparatus 70 into the processing container 301. In an open state, the opening/closing valves 52a and 52b allow the processing fluid to be flown to the supply line on the downstream side. In a closed state, the opening/closing valves 52a and 52b do not allow the processing fluid to be flown to the supply line on the downstream side. By way of example, when the opening/closing valves 52a and 52b are in the open state, the processing fluid having a high pressure ranging from about 16 MPa to 20 MPa (mega pascal) is supplied from the supercritical fluid producing apparatus 70 to the supply line via the opening/closing valves 52a and 52b.

A first supply line 63 extending from the opening/closing valves 52a and 52b to the processing container 301 is connected to a supply port 313 illustrated in FIG. 2. The processing fluid from the opening/closing valves 52a and 52b is supplied into the container main body 311 of the processing container 301 through the supply port 313 illustrated in FIG. 2.

In the supercritical processing apparatus 3 illustrated in FIG. 3, the supply line between the filter 57 and the opening/closing valves 52a and 52b is branched. That is, a second supply line 64 is branched from the supply line between the filter 57 and the opening/closing valves 52a and 52b and extends to be connected to the processing container 301 via opening/closing valves 52c and 52d and orifices 55a and 55b. Further, a supply line is branched from the supply line between the filter 57 and the opening/closing valves 52a and 52b and extends to be connected to the outside via an opening/closing valve 52e.

The second supply line 64 connected to the processing container 301 via the opening/closing valves 52c and 52d and the orifices 55a and 55b is connected to the fluid supply nozzle 341 illustrated in FIG. 2. The second supply line 64 may be used to supply the processing fluid into the processing container 301, e.g., in a pressure increasing process to be described later. Further, the orifices 55a and 55b are configured to regulate a flow rate and a pressure of the processing fluid to be supplied into the processing container 301. When a relatively large amount of the processing fluid is supplied into the processing container 301, e.g., at the time when the supply of the processing fluid into the processing container 301 is started, the opening/closing valves 52c and 52d is adjusted to be in an open state and the processing fluid having the pressure regulated by the orifices 55a and 55b is supplied into the processing container 301.

The supply line connected to the outside via the opening/closing valve 52e is a flow path for draining the processing fluid from the supply line. For example, when the processing fluid remaining in the supply line is to be discharged to the outside at the time when the power of the supercritical processing apparatus 3 is turned off, the opening/closing valve 52e is adjusted to be in an open state and the supply line communicates with the outside.

Further, a supply line connected to a purging device 62 via an opening/closing valve 52f is branched from the second supply line 64 on the downstream side of the orifice 55b. The supply line connected to the purging device 62 is a flow path for supplying an inert gas such as nitrogen into the processing container 301 and is used while the supply of the processing fluid from the supercritical fluid producing apparatus 70 into the processing container 301 is stopped. For example, when the processing container 301 is to be filled with the inert gas and kept in a clean state, the opening/closing valve 52f is adjusted to be in an open state and the inert gas sent from the purging device 62 to the supply line is supplied into the processing container 301 via the opening/closing valve 52f.

On the downstream side of the processing container 301, opening/closing valves 52g to 52j and a back pressure valve 59 are provided. The opening/closing valves 52g to 52j are configured to regulate on and off of the drain of the processing fluid from the processing container 301. When the processing fluid is to be drained from the processing container 301, the opening/closing valves 52g to 52j are adjusted to be in an open state, and when the processing fluid is not to be drained from the processing container 301, the opening/closing valves 52g to 52j are adjusted to be in a closed state. The back pressure valve 59 is opened when a primary side pressure (which is the same as the pressure within the processing container 301) exceeds a set pressure. Thus, the fluid is flown toward a secondary side and the primary side pressure is kept at the set pressure. The set pressure of the back pressure valve 59 can be changed by the controller 4 at any time. Meanwhile, a supply line (a discharge-side supply line 65) extending between the processing container 301 and the opening/closing valves 52g to 52j is connected to a discharge port 314 illustrated in FIG. 2. The fluid within the container main body 311 of the processing container 301 is sent toward the opening/closing valves 52g to 52j via the fluid discharge header 318 and the discharge port 314 illustrated in FIG. 2.

[Configuration of Supercritical Fluid Producing Apparatus]

Hereinafter, the configuration of the supercritical fluid producing apparatus 70 will be described.

As illustrated in FIG. 3, the supercritical fluid producing apparatus 70 includes a gas supply line 71a, a cooler 72, a storage tank 73, a pump 74, a buffer tank 80, a heating device 75 and a supercritical fluid supply line 71c. The gas supply line 71a, the cooler 72, the storage tank 73, the pump 74, the buffer tank 80, the heating device 75 and the supercritical fluid supply line 71c are placed within a housing 79.

The gas supply line 71a supplies a gaseous processing fluid (carbon dioxide ($CO_2$) in the present exemplary embodiment; also referred to as a "processing gas") sent from the outside of the supercritical fluid producing apparatus 70 toward the cooler 72. A gas supply tank 90 is also provided outside the supercritical fluid producing apparatus 70, and the gas supply line 71a is connected to the gas supply tank 90. The gas supply tank 90 stores and supplies the processing gas. The processing gas is supplied from the gas supply tank 90 to the gas supply line 71a. Meanwhile, in the gas supply line 71a, the pressure of the processing gas is, e.g., from 4 MPa to 6 MPa and the temperature of the processing gas is, e.g., from −10° C. to 75° C.

On the gas supply line 71a between the gas supply tank 90 and the cooler 72, an opening/closing valve 82a, filters 87a to 87d, an opening/closing valve 82b and a check valve 88 are provided in this order from the upstream side toward the downstream side.

The opening/closing valve 82a controls on and off of the supply of the processing gas from the gas supply tank 90. In an open state, the opening/closing valve 82a allows the processing gas to be flown to the gas supply line 71a on the downstream side. In a closed state, the opening/closing valve 82a does not allow the processing gas to be flown to the gas supply line 71a on the downstream side. When the opening/closing valve 82a is in the open state, the processing gas is supplied from the gas supply tank 90 to the gas supply line 71a via the opening/closing valve 82a.

Each of the filters 87a to 87d is configured to adsorb and remove moisture or the like contained in the processing gas flowing in the gas supply line 71a and allow the processing gas from which the moisture or the like is removed to be flown toward the downstream side. In this case, a plurality of (four) filters 87a to 87d are arranged in parallel on the gas supply line 71a. As a result, a pressure loss of the processing gas in the gas supply line 71a can be suppressed and the maintenance of the filters 87a to 87d can be easily performed.

The opening/closing valve 82b controls on and off of the supply of the processing gas flowing in the gas supply line 71a. Also, the check valve 88 is configured to suppress a backflow of the processing fluid (the processing gas or the processing liquid) from the cooler 72 toward the upstream side (toward the filters 87a to 87d).

Further, in FIG. 3, the gas supply line 71a is branched between the filters 87a to 87d and the opening/closing valve 82a. That is, a bypass processing gas line 71d and a vent line 71e are branched to extend from the gas supply line 71a between the filters 87a to 87d and the opening/closing valve 82a. The bypass processing gas line 71d sends the processing gas from the opening/closing valve 82a into the check valve 88 without passing through the filters 87a to 87d. The vent line 71e connects the gas supply line 71a to the outside.

An opening/closing valve 82c is provided on the bypass processing gas line 71d. The opening/closing valve 82c controls on and off of the supply of the processing gas flowing in the bypass processing gas line 71d. The vent line 71e is a line for discharging the gas from the gas supply line 71a to the outside. An opening/closing valve 82d is provided on the vent line 71e. The opening/closing valve 82d controls whether to discharge the processing gas flowing in the vent line 71e to the outside. For example, when the processing gas remaining in the gas supply line 71a between the opening/closing valve 82a and the check valve 88 is to be discharged to the outside at the time when the power of the supercritical fluid producing apparatus 70 is turned off, the opening/closing valve 82d is adjusted to be in an open state. Thus, the gas supply line between the opening/closing valve 82a and the check valve 88 communicates with the outside.

The gas supply line 71a is connected to the inlet side of the cooler 72. The cooler 72 is configured to cool the processing gas from the gas supply line 71a so as to liquefy the processing gas and produce a processing fluid in a liquid state (also referred to as a "processing liquid"). Cooling water is supplied into the cooler 72 from a non-illustrated external chiller, and the processing gas is cooled by the cooling water. The cooler 72 cools the processing gas to produce the processing liquid so that the processing fluid (the processing liquid) can be sent toward the buffer tank 80 by using the pump 74. Also, on the outlet side of the cooler 72, the pressure of the processing liquid is, e.g., from 4 MPa to 6 MPa and the temperature of the processing liquid is, e.g., from 0° C. to 5° C.

A liquid supply line 71b is connected to the outlet side of the cooler 72. This liquid supply line 71b supplies the processing liquid from the cooler 72 toward the buffer tank 80. The liquid supply line 71b extends from the cooler 72 to the buffer tank 80 via the storage tank 73 and the pump 74 in this order.

The storage tank 73, an opening/closing valve 82e, a pump inlet-side pressure gauge 95 and a pump inlet-side thermometer 96 are provided on the liquid supply line 71b between the cooler 72 and the pump 74. The storage tank 73 temporarily stores the processing liquid produced by being cooled and liquefied in the cooler 72. Cooling water is supplied into the storage tank 73 from, e.g., the above-described chiller so that the processing liquid in the storage tank 73 is cooled. In this case, the processing liquid in the storage tank 73 is kept at, e.g., from 0° C. to 5° C. As described above, the storage tank 73 is provided between the cooler 72 and the pump 74 so that the processing liquid produced by being liquefied in the cooler 72 may be stably sent into the pump 74.

The opening/closing valve 82e controls on and off of the supply of the processing liquid sent from the storage tank 73. In an open state, the opening/closing valve 82e allows the processing liquid to be flown to the liquid supply line 71b on the downstream side. In this case, the processing liquid from the storage tank 73 is supplied into the pump 74 through the liquid supply line 71b. In a closed state, the opening/closing valve 82e does not allow the processing liquid to be flown to the liquid supply line 71b on the downstream side.

The pump inlet-side pressure gauge 95 is provided on the liquid supply line 71b at the inlet side of the pump 74 and measures the pressure of the processing fluid at the inlet of the pump 74. The pump inlet-side thermometer 96 is provided on the liquid supply line 71b at the inlet side of the pump 74 and measures the temperature of the processing fluid at the inlet of the pump 74.

The inlet side of the pump 74 is connected to the cooler 72 via the storage tank 73. The pump 74 functions to increase the pressure of the processing liquid from the cooler 72 and send out the processing liquid toward the outlet side of the pump 74. On the outlet side of the pump 74, the pressure of the processing liquid exceeds a threshold pressure required to change the processing liquid into the supercritical fluid, and is increased to, e.g., 7.4 MPa to 23 MPa. Also, on the outlet side of the pump 74, the temperature of the processing liquid is, e.g., from 15° C. to 30° C.

The pump 74 is, e.g., a diaphragm pump and configured to repeatedly suck and send out the processing liquid. A volume of the processing liquid sent out from the pump 74 per unit time can be controlled by the controller 4.

Figure 4A:
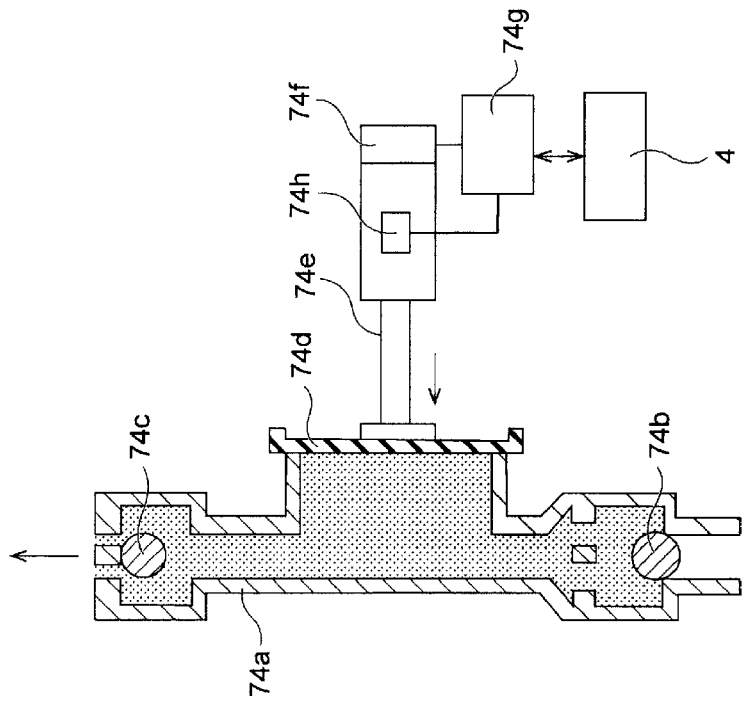
FIG. 4A and FIG. 4B are cross-sectional views schematically illustrating a pump of the supercritical processing apparatus.
Figure 4B:
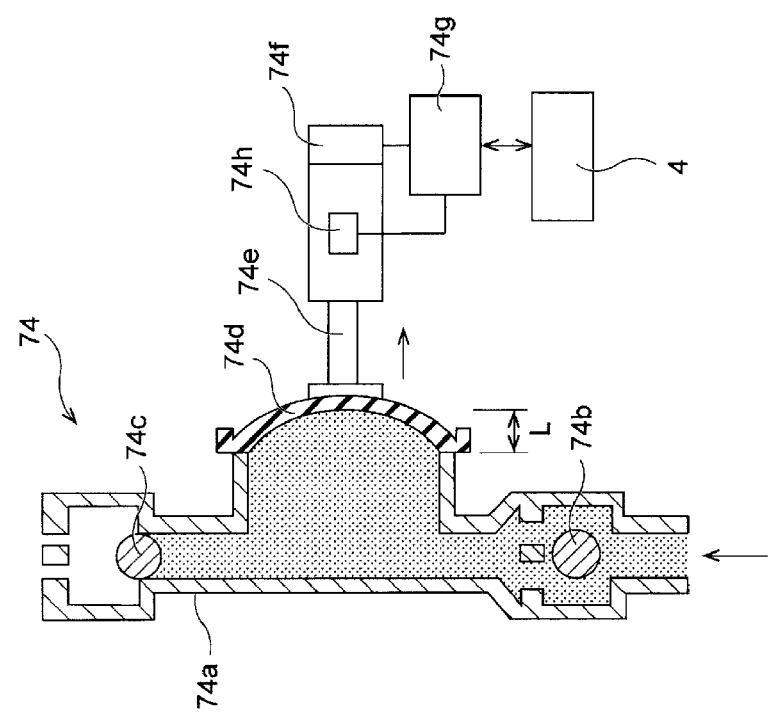

FIG. 4A and FIG. 4B are schematic cross-sectional views illustrating the pump 74. In FIG. 4A and FIG. 4B, the lower side is the inlet side (suction side) of the pump 74 and the upper side is the outlet side (discharge side) of the pump 74. As illustrated in FIG. 4A and FIG. 4B, the pump 74 is equipped with a pump head 74a, a suction-side check valve 74b and a discharge-side check valve 74c placed within the pump head 74a, and a diaphragm 74d mounted on the pump head 74a. The diaphragm 74d is connected to a (hydraulic or direct drive) piston 74e configured to drive the diaphragm 74d. The piston 74e is equipped with a piston control mechanism 74f configured to control a stroke length L of the piston 74e, and the piston control mechanism 74f is driven by a servomotor 74g. Further, the piston 74e is equipped with a stroke position monitoring mechanism 74h configured to monitor a stroke position of the piston 74e. The controller 4 can monitor the stroke position of the piston 74e with the stroke position monitoring mechanism 74h and control the stroke length L of the piston 74e via the piston control mechanism 74f by controlling the servomotor 74g.

When the pump 74 performs the suction, the piston 74e contracts and the diaphragm 74d is pulled toward the piston 74e as illustrated in FIG. 4A, and, thus, the processing liquid is sucked from the inlet side of the pump head 74a. When the pump 74 performs the discharge, the piston 74e extends and the diaphragm 74d is pushed by the piston 74e as illustrated in FIG. 4B, and, thus, the processing liquid is discharged from the outlet side of the pump head 74a.

Referring to FIG. 3, the buffer tank 80 is connected to the outlet side of the pump 74. The buffer tank 80 absorbs a pressure variation or pulsation of the processing fluid (the processing liquid or the supercritical fluid) sent out from the pump 74 and flowing in the supply line (the liquid supply line 71b, the supercritical fluid supply line 71c) between the pump 74 and the heating device 75. The processing liquid flows from the liquid supply line 71b into the buffer tank 80. The processing liquid flown into the buffer tank 80 is heated within the buffer tank 80. As a result, the temperature of the processing liquid exceeds a threshold temperature required for the change into the supercritical fluid, and the processing liquid becomes the processing fluid in the supercritical state (also referred to as a "supercritical fluid") to flow out from the buffer tank 80.

On the outlet side of the buffer tank 80, the pressure of the supercritical fluid is, e.g., from 7.4 MPa to 23 MPa. Further, on the outlet side of the buffer tank 80, the temperature of the supercritical fluid is increased to, e.g., 30° C. to 40° C.

The supercritical fluid supply line 71c is connected to the outlet side of the buffer tank 80. The supercritical fluid supply line 71c sends the supercritical fluid from the buffer tank 80 to the outside of the supercritical fluid producing apparatus 70 (toward the processing container 301) via the heating device 75. The supercritical fluid supply line 71c extends from the buffer tank 80 to the outside of the supercritical fluid producing apparatus 70 via the heating device 75.

The heating device 75 is connected to the outlet side of the buffer tank 80. The heating device 75 heats the supercritical fluid from the buffer tank 80. As the supercritical fluid is heated within the heating device 75, the supercritical fluid is heated to a temperature suitable for the supercritical drying processing in the processing container 301. Specifically, the temperature of the supercritical fluid is increased to, e.g., 40° C. to 100° C. on the outlet side of the heating device 75. Further, on the outlet side of the heating device 75, the pressure of the supercritical fluid is, e.g., from 7.4 MPa to 23 MPa.

At the supercritical fluid supply line 71c on the downstream side of the heating device 75, filters 89a and 89b and an opening/closing valve 82f are provided in this order from the upstream side toward the downstream side. Further, on the downstream side of the opening/closing valve 82f, an outlet-side pressure gauge 97 configured to monitor the pressure of the supercritical fluid at the outlet of the supercritical fluid producing apparatus 70 is provided.

Each of the filters 89a and 89b is configured to remove particles or the like contained in the supercritical fluid flowing in the supercritical fluid supply line 71c and allow the supercritical fluid from which the particles or the like is removed to be flown toward the downstream side. In this case, a plurality of (two) filters 89a and 89b are arranged in parallel on the supercritical fluid supply line 71c. As a result, a pressure loss of the supercritical fluid in the supercritical fluid supply line 71c can be suppressed and the maintenance of the filters 89a and 89b can be easily performed.

The opening/closing valve 82f controls on and off of the supply of the supercritical fluid flowing in the supercritical fluid supply line 71c. In this case, the opening/closing valve 82f controls whether to send out the supercritical fluid from the supercritical fluid producing apparatus 70 to the processing container 301. That is, in a state where the opening/closing valve 82f is opened, the supercritical fluid is supplied from the supercritical fluid producing apparatus 70 to the processing container 301. Meanwhile, in a state where the opening/closing valve 82f is closed, the supercritical fluid is not supplied from the supercritical fluid producing apparatus 70 to the processing container 301.

The downstream side of the heating device 75 and the upstream side of the cooler 72 are connected to each other by a circulation line 71l configured to return the processing fluid from the downstream side of the pump 74 toward the upstream side of the pump 74. More specifically, the circulation line 71l connects a downstream-side branched portion 91b located between the filters 89a and 89b and the opening/closing valve 82f with an upstream-side branched portion 91a located between the check valve 88 and the cooler 72.

In addition, an opening/closing valve 82g and a pressure control valve 76 are provided on the circulation line 71l. The opening/closing valve 82g controls on and off of the passage of the processing fluid (the supercritical fluid) flowing in the circulation line 71l from the downstream-side branched portion 91b toward the upstream-side branched portion 91a. That is, in a state where the opening/closing valve 82g is opened, the supercritical fluid flows from the downstream-side branched portion 91b toward the pressure control valve 76. Meanwhile, in a state where the opening/closing valve 82f is closed, the supercritical fluid does not flow from the downstream-side branched portion 91b toward the pressure control valve 76. The opening/closing valve 82g is usually maintained in the open (on) state while the supercritical fluid producing apparatus 70 produces the supercritical fluid. Thus, the supercritical fluid supply line 71c and the pressure control valve 76 are usually maintained in a state of communicating with each other.

The pressure control valve 76 functions to keep constant the pressure of the processing fluid (the supercritical fluid) flowing therein. When the pressure of the processing fluid flowing in the pressure control valve 76 exceeds a preset pressure threshold value, the pressure control valve 76 allows the processing fluid to be flown from the inlet side of the pressure control valve 76 (from the downstream-side branched portion 91b) toward the outlet side thereof (toward the upstream-side branched portion 91a). Meanwhile, when the pressure of the processing fluid flowing in the pressure control valve 76 does not exceed the pressure threshold value, the pressure control valve 76 does not allow the processing fluid to be flown therein.

Meanwhile, when the pressure of the processing fluid flowing in the pressure control valve 76 exceeds the pressure threshold value, the processing fluid flows from the inlet side of the pressure control valve 76 (from the downstream-side branched portion 91b) toward the outlet side thereof (toward the upstream-side branched portion 91a). The pressure of the processing fluid passed through the pressure control valve 76 decreases and is vaporized to be returned back to the processing gas. This processing gas passes through the upstream-side branched portion 91a and flows into the cooler 72 again. After a certain amount of the processing fluid flows from the inlet side of the pressure control valve 76 toward the outlet side thereof, the pressure in the circulation line 71f connected to the inlet side of the pressure control valve 76 decreases. Thereafter, when the pressure within the pressure control valve 76 falls below the pressure threshold value, the flow of the processing fluid within the pressure control valve 76 is stopped. By appropriately setting the pressure threshold value of the pressure control valve 76 as described above, it is possible to set an upper limit of the pressure of the supercritical fluid sent into the processing container 301 from the supercritical fluid producing apparatus 70. Specifically, when the pressure of the supercritical fluid sent into the processing container 301 from the supercritical fluid producing apparatus 70 exceeds the pressure threshold value, a part of the supercritical fluid flows out toward the upstream-side branched portion 91a via the pressure control valve 76. As a result, the pressure of the supercritical fluid flowing in the circulation line 71f decreases to the pressure threshold value. In this way, the pressure of the supercritical fluid sent into the processing container 301 from the supercritical fluid producing apparatus 70 is kept constant.

[Method of Producing Supercritical Fluid]

Hereinafter, a method of producing the supercritical fluid from the processing gas by using the supercritical fluid producing apparatus 70 will be described with reference to FIG. 3.

First, the opening/closing valves 82a, 82b, 82e, 82f and 82g of the supercritical fluid producing apparatus 70 are set to be in the open (on) state and the opening/closing valves 82c and 82d are set to be in the closed (off) state.

Then, the gaseous processing fluid (the processing gas) is supplied from the gas supply tank 90 to the supercritical fluid producing apparatus 70. This processing gas flows through the gas supply line 71a of the supercritical fluid producing apparatus 70 and is sent to the cooler 72. Meanwhile, the processing gas passes through the opening/closing valve 82a, the filters 87a to 87d, the opening/closing valve 82b and the check valve 88 in this order which are provided on the gas supply line 71a. Then, while the processing gas passes through the filters 87a to 87d, the moisture contained in the processing gas is removed.

Then, in the cooler 72, the processing gas from the gas supply line 71a is cooled, and, thus, the processing fluid in the liquid state (the processing liquid) is produced. This processing liquid passes through the liquid supply line 71b, and is sent from the cooler 72 into the storage tank 73 to be temporarily stored in the storage tank 73. Then, the processing liquid from the storage tank 73 is supplied to the buffer tank 80 using the pump 74. Meanwhile, the processing liquid passes through the opening/closing valve 82e provided on the liquid supply line 71b, and is compressed by the pump 74 to a pressure of, e.g., from about 7.4 MPa to 23 MPa.

Subsequently, the processing liquid having a high pressure flows into the buffer tank 80. The processing liquid flown into the buffer tank 80 is heated within the buffer tank 80 so as to become the processing fluid in the supercritical state (the supercritical fluid) and flow out from the buffer tank 80. Meanwhile, on the outlet side of the buffer tank 80, the pressure of the supercritical fluid is, e.g., from 7.4 MPa to 23 MPa and the temperature of the supercritical fluid is, e.g., from 30° C. to 40° C.

As described above, the processing liquid and the supercritical fluid are stored together in the buffer tank 80, so that the interface between the non-compressive processing liquid and the compressive supercritical fluid moves up and down. For this reason, even when the pressure of the supercritical fluid in the supercritical fluid supply line 71c fluctuates by switching on and off of the opening/closing valve 82f, the interface moves up and down so that the pressure fluctuation can be absorbed. Further, since the interface between the processing liquid and the supercritical fluid in the buffer tank 80 moves up and down, the pulsation of the processing liquid sent from the pump 74 can be absorbed.

Subsequently, the supercritical fluid flowing out from the buffer tank 80 reaches the heating device 75 via the supercritical fluid supply line 71c. In the heating device 75, the supercritical fluid is heated to a temperature suitable for the supercritical drying processing in the processing container 301 and reaches a temperature of, e.g., from about 40° C. to about 100° C.

Then, after the supercritical fluid is heated in the heating device 75, the supercritical fluid passes through the filters 89a and 89b and the opening/closing valve 82f in this order which are provided on the supercritical fluid supply line 71c, and flows out from the supercritical fluid producing apparatus 70 to the processing container 301. Meanwhile, the particles or the like in the supercritical fluid are removed by the filters 89a and 89b.

A part of the supercritical fluid is branched from the supercritical fluid supply line 71c at the downstream-side branch portion 91b and flows into the circulation line 71f. In this circulation line 71f, the supercritical fluid reaches the pressure control valve 76 via the opening/closing valve 82g. Then, when the pressure of the supercritical fluid flowing in the pressure control valve 76 exceeds the preset pressure threshold value, the pressure control valve 76 allows the supercritical fluid to be flown toward the upstream-side branched portion 91a. At this time, the pressure of the supercritical fluid that has passed through the pressure control valve 76 decreases and is vaporized to be returned back to the processing gas. This processing gas passes through the upstream-side branched portion 91a and flows into the cooler 72 again. When the pressure of the supercritical fluid does not exceed the pressure threshold value, the pressure control valve 76 does not allow the supercritical fluid to be flown. In this way, the pressure of the supercritical fluid sent into the processing container 301 from the supercritical fluid producing apparatus 70 is kept constant.

[Supercritical Drying Processing]

Hereinafter, an IPA drying mechanism using the processing fluid in the supercritical state (e.g., carbon dioxide ($CO_2$)) will be briefly described with reference to FIG. 5A to FIG. 5D.

Figure 5A:
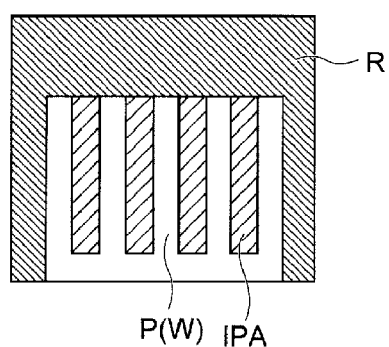
FIG. 5A to FIG. 5D are diagrams for explaining an IPA drying mechanism.

Immediately after a processing fluid R in a supercritical state is introduced into the processing container 301, only IPA exists within a recess of a pattern P of the wafer W, as illustrated in FIG. 5A.

Figure 5B:
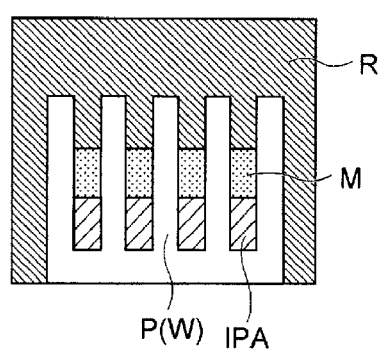

As the IPA within the recess come into contact with the processing fluid R in the supercritical state, the IPA is gradually dissolved in the processing fluid R and gradually replaced with the processing fluid R, as illustrated in FIG. 5B. At this time, in addition to the IPA and the processing fluid R, a mixed fluid M in a state where the IPA and the processing fluid R are mixed with each other exists within the recess.

Figure 5C:
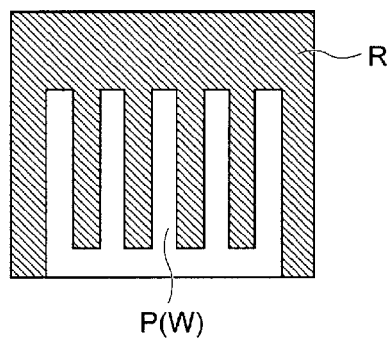

As the IPA is replaced with the processing fluid R within the recess, the IPA existing within the recess is reduced and only the processing fluid R in the supercritical state finally exists within the recess, as illustrated in FIG. 5C.

Figure 5D:
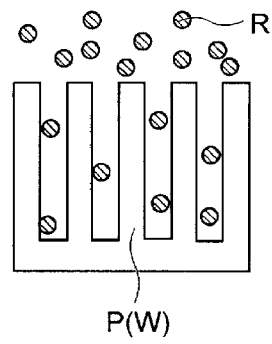

After the IPA is removed from the recess, the pressure within the processing container 301 is lowered to the atmospheric pressure. Thus, as illustrated in FIG. 5D, the state of the processing fluid R is changed from the supercritical state into the gas state and the recess is occupied by only the gas. In this way, the IPA within the recess of the pattern P is removed and the drying processing of the wafer W is completed.

[Drying Method]

Hereinafter, the drying method (the substrate processing method) performed in the supercritical processing apparatus 3 will be described. Also, the drying method described below is automatically performed under the control of the controller 4 based on a process recipe and a control program stored in the storage 19.

<Carry-In Process>

The wafer W subjected to the cleaning processing in the cleaning device 2 (see FIG. 1) is carried out from the cleaning device 2 by the second transfer device 161 in the state where the recess of the pattern on the surface of the wafer W are filled with the IPA and a puddle (liquid film) of the IPA is formed on the surface of the wafer W. The second transfer device 161 places the wafer on the holding plate 316 (see FIG. 2) of the processing container 301. Then, the holding plate 316 on which the wafer is placed enters the container main body 311 and the cover member 315 is airtightly engaged with the container main body 311. In this way, the carry-in process of carrying the wafer W into the processing container 301 is completed.

Figure 6:
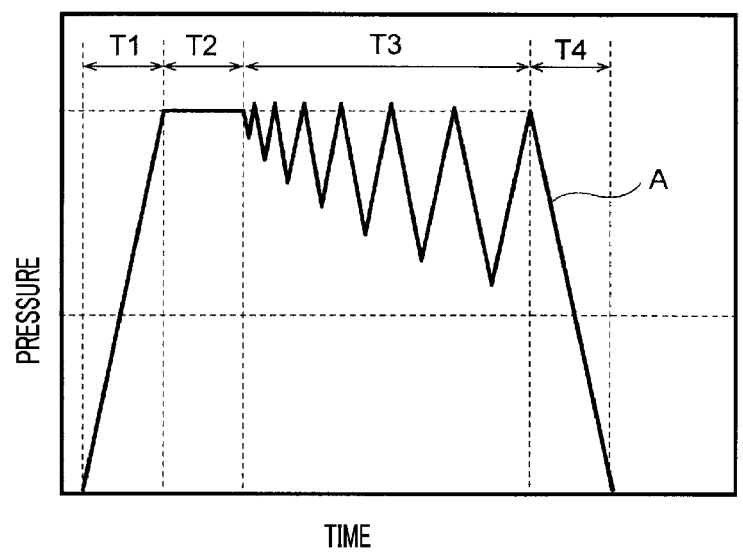
FIG. 6 is a graph showing a change in pressure within the processing container during a drying processing.

Then, the processing fluid ($CO_2$) is supplied into the processing container 301 according to the procedure illustrated in the time chart of FIG. 6, and the drying processing of the wafer W is performed. In FIG. 6, a polygonal line A indicates the relationship between an elapsed time from the start of the drying processing and the pressure within the processing container 301.

<Pressure Increasing Process>

First, a pressure increasing process T1 of increasing the pressure within the processing container 301 with the supercritical fluid is performed. In the pressure increasing process T1, $CO_2$ (carbon dioxide) as the processing fluid is supplied into the processing container 301 from the supercritical fluid producing apparatus 70. Specifically, the opening/closing valves 52c and 52d are opened and the opening/closing valves 52a, 52b and 52e to 52j are closed. Also, the orifices 55a and 55b are adjusted to a predetermined opening degree. Further, the set pressure of the back pressure valve 59 is set to a pressure, e.g., 17 MPa, at which the $CO_2$ within the processing container 301 can be kept in the supercritical state.

In the pressure increasing process T1, the controller 4 determines a first supply rate $Q_1$ at which the pump 74 supplies the $CO_2$ to the processing container 301, and the pump 74 supplies the $CO_2$ to the processing container 301 at the first supply rate $Q_1$. In this case, the first supply rate $Q_1$ is determined based on a target time $t_1$ during which the pressure increase within the processing container 301 is performed, an amount $W_{c1}$ of $CO_2$ required for the pressure increase and a density $\rho_{p1}$ of $CO_2$ at the inlet of the pump 74.

The target time t, refers to a time period during which the pressure within the processing container 301 increases from the atmospheric pressure to a processing pressure $P_{c1}$ (about 17 MPa) required for processing the wafer W. The target time $t_1$ may be different for each wafer W and may be set to, e.g., from 40 seconds to 70 seconds, and desirably from 45 seconds to 60 seconds. Since the target time $t_i$ is set to 40 seconds or more, the IPA present on the wafer W can be sufficiently dissolved by the $CO_2$ (supercritical fluid), and, thus, it is possible to suppress the generation of particles on the wafer W. Since the target time $t_i$ is set to 70 seconds or less, a pressure increasing time is reduced, and, thus, it is possible to suppress the volatilization and the drying of the IPA present on the wafer W before the inside of the processing container 301 becomes in the supercritical state. Therefore, it is possible to suppress the collapse of the pattern. Further, the target time $t_i$ may be previously determined for each target wafer W according to the process recipe stored in the controller 4.

The controller 4 may calculate the amount $W_{c1}$ of $CO_2$ required for the pressure increase within the processing container 301 based on the processing pressure $P_{c1}$ for the wafer W, a processing temperature $T_{c1}$ for the wafer W and a volume $V_a$ of the processing container 301. Specifically, the controller 4 obtains the density $\rho_{c1}$ of $CO_2$ (supercritical fluid) within the processing container 301 from a state equation based on the processing pressure $P_{c1}$ and the processing temperature $T_{c1}$ for the wafer W. The amount $W_{c1}$ of $CO_2$ required for the pressure increase within the processing container 301 can be obtained by multiplying the density $\rho_{p1}$ of $CO_2$ by the volume $V_a$ of the processing container 301.

The processing pressure $P_{c1}$ for the wafer W is a pressure at which the wafer W within the processing container 301 is dried, and may be, e.g., about 17 MPa. The processing temperature $T_{c1}$ for the wafer W is a temperature at which the wafer W within the processing container 301 is dried, and may be, e.g., about 90° C. The processing pressure $P_{c1}$ for the wafer W may be previously determined for each target wafer W according to the process recipe stored in the controller 4. Further, the processing temperature $T_{c1}$ for the wafer W may be previously determined for each processing container 301. Furthermore, the volume $V_a$ of the processing container 301 is previously determined for the corresponding processing container 301.

The density $\rho_{p1}$ of $CO_2$ at the inlet of the pump 74 can be obtained based on a pressure $P_{p1}$ of $CO_2$ at the inlet of the pump 74 and a temperature $T_{p1}$ of $CO_2$ at the inlet of the pump 74. As the pressure $P_{p1}$ of $CO_2$ at the inlet of the pump 74, a value measured by the pump inlet-side pressure gauge 95 may be used. Further, as the temperature $T_{p1}$ of $CO_2$ at the inlet of the pump 74, a value measured by the pump inlet-side thermometer 96 may be used.

The first supply rate $Q_1$ is a rate at which the $CO_2$ flows out from the pump 74 and refers to the volume of $CO_2$ sent out from the pump 74 per predetermined time. The first supply rate $Q_1$ is obtained by dividing a value (a pump supply rate $Q_{p1}$), acquired by dividing the amount $W_{c1}$ of $CO_2$ required for the pressure increase within the processing container 301 by the target time $t_1$ during which the pressure increase within the processing container 301 is performed, by the density $\rho_{p1}$ of $CO_2$ at the inlet of the pump 74.

Figure 7:
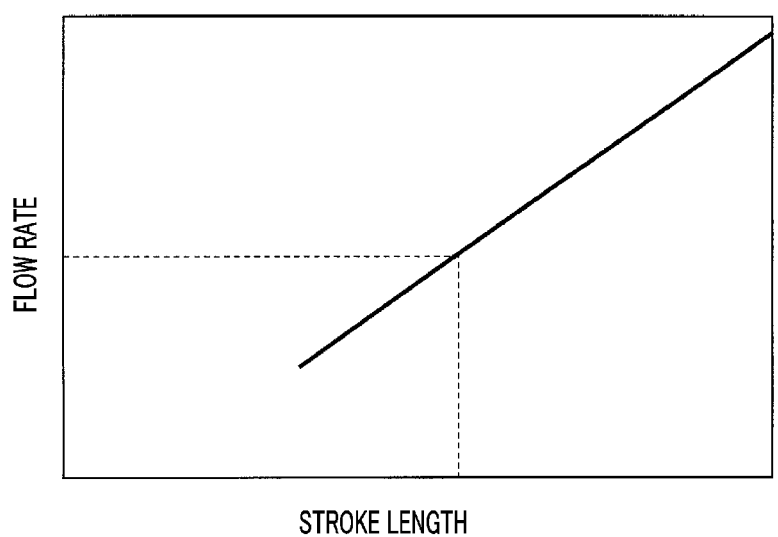
FIG. 7 is a graph showing a performance graph of the pump.

The supercritical fluid producing apparatus 70 supplies the $CO_2$ to the processing container 301 based on the first supply rate $Q_1$ determined as described above. Specifically, the controller 4 adjusts a stroke length $L_{s1}$ of the pump 74 based on the first supply rate $Q_1$. That is, the controller 4 controls the stroke length $L_{s1}$ of the pump 74 via the piston control mechanism 74f by controlling the servomotor 74g (see FIG. 4A and FIG. 4B) of the pump 74. The relationship between the first supply rate $Q_1$ and the stroke length $L_{s1}$ is determined for, e.g., each pump 74 as shown in a performance graph (FIG. 7), and the controller 4 may set the stroke length $L_{s1}$ to realize the first supply rate $Q_1$ based on the performance graph. Further, the stroke length $L_{s1}$ is usually set longer than a stroke length of the pump 74 before the pressure increasing process T1 is performed (on standby).

Hereinafter, a specific example of calculating the stroke length of the pump 74 in the pressure increasing process T1 will be described (Table 1). In the following conditions, the stroke length $L_{s1}$ is set to 12.5 mm.

TABLE 1

| | Item | Value | Calculating method |
|---|---|---|---|
| a | Target time $t_i$ | 45 sec | Based on process recipe |
| b | Processing pressure $P_{c1}$ | 17 MPa | Based on process recipe |
| c | Processing temperature $T_{c1}$ | 90° C. | Determined for each processing container |
| d | Volume $V_a$ of processing container | 1 L | Determined for each processing container |
| e | Density $\rho_{p1}$ of $CO_2$ within processing container | 443 kg/m³ | Calculated from $P_{c1}$ and $T_{c1}$ (state equation) |
| f | Amount $W_{c1}$ of $CO_2$ required for pressure increase | 0.443 kg | $\rho_{c1} \times V_a$ |
| g | Pressure $P_{p1}$ of $CO_2$ at inlet of the pump | 4.5 MPa | Measured value |
| h | Temperature $T_{p1}$ of $CO_2$ at inlet of pump | −3° C. | Measured value |
| i | Density $\rho_{p1}$ of $CO_2$ at inlet of pump | 955 kg/m³ | Calculated from $P_{p1}$ and $T_{p1}$ |
| j | Pump supply rate $Q_{p1}$ | 0.591 kg/min | $W_{c1}/t_i$ |
| k | First supply rate $Q_1$ | 38 L/H | $Q_{p1}/\rho_{p1}$ |
| l | Stroke length $L_{s1}$ of pump | 12.5 mm | Calculated from $Q_1$ (performance graph) |

The pump 74 supplies the $CO_2$ to the processing container 301 in a state where the stroke length $L_{s1}$ capable of realizing the first supply rate $Q_1$ is achieved. Accordingly, the $CO_2$ in the supercritical state at a pressure of about 17 MPa is discharged from the supercritical fluid producing apparatus 70 toward a lower surface of the holding plate 316 through the second supply line 64 located right under the central portion of the wafer W.

The $CO_2$ discharged from the fluid supply nozzle 341 (see FIG. 2) collides with the holding plate 316 covering the lower surface of the wafer W, and then, is diffused radially along the lower surface of the holding plate 316. Thereafter, the $CO_2$ flows into the space at the side of the upper surface of the wafer W through a gap between the edge of the holding plate 316 and the side wall of the container main body 311 and through the opening 316a of the holding plate 316. Since the back pressure valve 59 is kept fully closed until the set pressure (17 MPa) is reached, the $CO_2$ does not flow from the processing container 301. For this reason, the pressure within the processing container 301 gradually increases.

In the pressure increasing process T1, the pump 74 supplies the $CO_2$ to the processing container 301 at the first supply rate $Q_1$, and thus, the pressure within the processing container 301 rapidly increases to reach the processing pressure (about 17 MPa). As such, the pressure increasing time for the processing fluid within the processing container 301 is reduced to the target time $t_1$, and thus, it is possible to suppress the volatilization and the drying of the IPA present on the wafer W before the inside of the processing container 301 becomes in the supercritical state. Therefore, it is possible to suppress the collapse of the pattern.

<Maintaining Process>

When the pressure within the processing container 301 increases to the processing pressure (about 17 MPa) in the pressure increasing process T1, the process proceeds to a maintaining process T2 of maintaining the pressure within the processing container 301 by closing the opening/closing valves 52c and 52d located on the upstream side of the processing container 301. The maintaining process T2 continues until the IPA concentration and the $CO_2$ concentration in the mixed fluid present within the recess of the pattern P of the wafer W reach predetermined concentrations (e.g., the IPA concentration becomes equal to or less than 30%, and the $CO_2$ concentration becomes equal to or more than 70%). The time for the maintaining process T2 may be determined by experiments. In the maintaining process T2, the opening/closing state of the other valves is the same as in the pressure increasing process T1.

<Circulating Process>

A circulating process T3 is performed after the maintaining process T2. The circulating process T3 is a process of circulating the $CO_2$ (carbon dioxide) serving as the processing fluid within the processing container 301. The circulating process T3 may be performed by alternately repeating a pressure decreasing processing and a pressure increasing processing. The pressure decreasing processing is a processing of decreasing the pressure within the processing container 301 by discharging the mixed fluid of the $CO_2$ and the IPA from the inside of the processing container 301. The pressure increasing processing is a processing of increasing the pressure within the processing container 301 by supplying new $CO_2$ without containing the IPA into the processing container 301 from the supercritical fluid producing apparatus 70.

For example, the circulating process T3 is performed by setting the opening/closing valves 52a, 52b, 52h and 52i to be in the open state and the opening/closing valves 52c, 52d, 52g and 52j to be in the closed state and repeatedly increasing and decreasing the set pressure of the back pressure valve 59. Alternatively, the circulating process T3 may be performed by repeating the opening and the closing of the opening/closing valves 52h and 52i in a state where the opening/closing valves 52a and 52b are opened, the opening/closing valves 52c, 52d, 52g and 52j are closed and the set pressure of the back pressure valve 59 is set to a low value.

In the circulating process T3, the $CO_2$ is supplied into the processing container 301 by the fluid supply header 317 (see FIG. 2). The fluid supply header 317 may supply the $CO_2$ at a higher flow rate than that in the fluid supply nozzle 341. In the circulating process T3, since the pressure within the process container 301 is maintained at a pressure sufficiently higher than a critical pressure, there is no problem in performing the drying even when the $CO_2$ at the high flow rate collides with the surface of the wafer W or flows near the surface of the wafer W. For this reason, the fluid supply header 317 is used in view of reduction of the processing time.

In the pressure increasing processing, the pressure within the processing container 301 is increased to the processing pressure (17 MPa). In the pressure decreasing processing, the pressure within the processing container 301 is decreased from the processing pressure to a predetermined pressure (higher than the critical pressure). In the pressure decreasing processing, the $CO_2$ is supplied into the processing container 301 through the fluid supply header 317 and the $CO_2$ is discharged from the processing container 301 through the fluid discharge header 318. For this reason, a laminar flow of the $CO_2$ flowing substantially in parallel with the surface of the wafer W is formed within the processing container 301.

The replacement of the IPA with the $CO_2$ within the recess of the pattern of the wafer W is promoted by performing the circulating process. The critical pressure of the mixed fluid decreases as the IPA is replaced with the $CO_2$ within the recess. Thus, the pressure within the processing container 301 at the time when each pressure decreasing processing is ended may be gradually lowered while meeting the condition that the pressure within the processing container 301 is higher than the critical pressure of the mixed fluid corresponding to the $CO_2$ concentration in the mixed fluid.

In the circulating process T3, the controller 4 determines a second supply rate $Q_2$ at which the pump 74 supplies the $CO_2$ to the processing container 301, and the pump 74 supplies the $CO_2$ to the processing container 301 at the second supply rate $Q_2$. In this case, the second supply rate $Q_2$ is determined based on a circulation time $t_v$ for circulating the $CO_2$ within the processing container 301, an amount $W_{c2}$ of $CO_2$ required for the circulation and a density $\rho_{p2}$ of $CO_2$ at the inlet of the pump 74.

The circulation time $t_v$ refers to a time period during which the $CO_2$ is circulated within the processing container 301 by alternately repeating the pressure decreasing processing and the pressure increasing processing within the processing container 301. The circulation time $t_v$ may be different for each wafer W and may be set to, e.g., from 45 seconds to 150 seconds, and desirably from 90 seconds to 180 seconds. Further, the circulation time $t_v$ may be previously determined for each target wafer W according to the process recipe stored in the controller 4.

The amount $W_{c2}$ of $CO_2$ required for the circulation within the processing container 301 can be obtained based on a processing pressure $P_{c2}$ for the wafer W, a processing temperature Tc2 for the wafer W, the volume $V_a$ of the processing container 301 and a number N of replacements within the processing container 301 with the $CO_2$ during the circulation. Specifically, the controller 4 obtains a density $\rho_{c2}$ of $CO_2$ (supercritical fluid) within the processing container 301 from a state equation based on the processing pressure Pa and the processing temperature $T_{c2}$ for the wafer W. The amount $W_{c2}$ of $CO_2$ required for the circulation within the processing container 301 can be obtained by multiplying the density $\rho_{p2}$ of $CO_2$ by the volume $V_a$ of the processing container 301 and the number N of replacements. Further, the number N of replacements is a number of replacements within the processing container 301 with the $CO_2$ in the circulating process T3, and refers to a number of times of performing an operation for replacing all $CO_2$ for the volume of the processing container 301. The number N of replacements may be determined by, e.g., the amount of the puddle of the IPA formed on the wafer W and an aspect ratio of the pattern of the wafer W.

The processing pressure $P_{c2}$ for the wafer W is a pressure for drying the wafer W within the processing container 301, and may be, e.g., about 16 MPa. The processing temperature $T_{c2}$ for the wafer W is a temperature for drying the wafer W within the processing container 301, and may be, e.g., from about 90° C. to about 100° C. The processing pressure $P_{c2}$ for the wafer W is previously determined for each target wafer W according to the process recipe stored in the controller 4. Further, the processing temperature $T_{c2}$ for the wafer W is previously determined for each processing container 301.

The density $\rho p_{p2}$ of $CO_2$ at the inlet of the pump 74 is obtained based on a pressure $P_{p2}$ and a temperature $T_{p2}$ of $CO_2$ at the inlet of the pump 74. The pressure $P_{p2}$ and the temperature $T_{p2}$ of $CO_2$ at the inlet of the pump 74 are measured by the pump inlet-side pressure gauge 95 and the pump inlet-side thermometer 96, respectively, as in the pressure increasing process T1.

The second supply rate $Q_2$ is a rate at which the $CO_2$ flows out from the pump 74 and refers to the volume of $CO_2$ sent out from the pump 74 per predetermined time. The second supply rate $Q_2$ is obtained by dividing a value (a pump supply rate $Q_{p2}$), acquired by dividing the amount $W_{c2}$ of $CO_2$ required for the circulation within the processing container 301 by the circulation time $t_v$, by the density $\rho_{p2}$ of $CO_2$ at the inlet of the pump 74.

The supercritical fluid producing apparatus 70 supplies the $CO_2$ to the processing container 301 based on the second supply rate $Q_2$ determined as described above. Specifically, the controller 4 may adjust a stroke length $L_{s2}$ of the pump 74 based on the second supply rate $Q_2$, as in the pressure increasing process T1. The controller 4 sets the stroke length $L_{s2}$ to realize the second supply rate $Q_2$ based on the performance graph (FIG. 7), as in the pressure increasing process T1.

Hereinafter, a specific example of calculating the stroke length of the pump 74 in the circulating process T3 will be described (Table 2). In the following conditions, the stroke length $L_{s2}$ is set to 10.0 mm.

70 toward the wafer W through the fluid supply header 317, and the IPA is replaced with the $CO_2$ within the recess. Further, the stroke length $L_{s2}$ is usually set shorter than the stroke length $L_{s1}$ of the pump 74 in the pressure increasing process T1. Therefore, the first supply rate $Q_1$ is faster (higher) than the second supply rate $Q_2$. However, the present disclosure is not limited thereto. For example, the stroke length $L_{s2}$ in the circulating process T3 may be set longer than the stroke length $L_{s1}$ in the pressure increasing process T1 and the second supply rate $Q_2$ may be set faster than the first supply rate $Q_1$. In this case, the circulation time $t_v$ can be reduced.

<Discharging Process>

When the replacement of the IPA with the $CO_2$ within the recess of the pattern is completed in the circulating process T3, a discharging process T4 is performed. The discharging process T4 is a process of discharging the $CO_2$ from the processing container 301 to set the pressure within the processing container 301 to be lower than at least the critical pressure of $CO_2$. The discharging process T4 may be performed by setting the opening/closing valves 52a, 52b, 52c, 52d and 52e to be in the closed state, setting the set pressure of the back pressure valve 59 to the normal pressure, setting the opening/closing valves 52g, 52h, 52i and 52j to be in the open state, and setting the opening/closing valve 52f to be in the closed state. When the pressure within the processing container 301 becomes lower than the critical pressure of $CO_2$ by the circulating process T4, the $CO_2$ in the supercritical state is vaporized to be escaped from the inside of the recess of the pattern. Accordingly, the drying processing of a single wafer W is ended.

When the $CO_2$ is discharged from the processing container 301 in the discharging process T4, if the flow rate and the pressure of $CO_2$ in the supercritical fluid producing apparatus 70 are too high, the pressure in the circulation line

TABLE 2

| | Item | Value | Calculating method |
|---|---|---|---|
| a | Circulation time $t_v$ | 100 sec | Based on process recipe |
| b | Processing pressure $P_{c2}$ | 16 MPa | Based on process recipe |
| c | Processing temperature $T_{c2}$ | 95° C. | Determined for each processing container |
| d | Volume $V_a$ of processing container | 1 L | Determined for each processing container |
| e | Density $\rho_{p2}$ of $CO_2$ within processing container | 385 kg/m³ | Calculated from $P_{c2}$ and $T_{c2}$ (state equation) |
| f | Number of replacements N | 2 times | Based on amount of the puddle of IPA and aspect ratio of pattern of wafer W |
| g | Amount $W_{c2}$ of $CO_2$ required for circulation | 0.770 kg | $\rho_{p2} \times V_a \times N$ |
| h | Pressure $P_{p2}$ of $CO_2$ at inlet of the pump | 5 MPa | Measured value |
| i | Temperature $T_{p2}$ of $CO_2$ at inlet of the pump | -4° C. | Measured value |
| j | Density $\rho_{p2}$ of $CO_2$ at inlet of the pump | 965 kg/m³ | Calculated from $P_{p2}$ and $T_{p2}$ |
| K | Pump supply rate $Q_{p2}$ | 0.462 kg/min | $W_{c2}/t_v$ |
| l | Second supply rate $Q_2$ | 29 L/H | $Q_{p2}/\rho_{p2}$ |
| m | Stroke length $L_{s2}$ of pump | 10.0 mm | Calculated from $Q_2$ (performance graph) |

The pump 74 supplies the $CO_2$ to the processing container 301 in a state where the stroke length $L_{s2}$ capable of realizing the second supply rate $Q_2$ is achieved. Accordingly, the $CO_2$ in the supercritical state at a pressure of about 16 MPa is discharged from the supercritical fluid producing apparatus 71f (see FIG. 3) may rapidly increase. That is, when the opening/closing valves 52a, 52b, 52c, 52d and 52e are closed, the pressure of $CO_2$ within the circulation line 71f may rapidly increase, which may cause a delay in the pressure control of the pressure control valve 76.

According to the present exemplary embodiment, in the discharging process T4, the pump 74 determines a third supply rate $Q_3$ at which the pump 74 sends out the $CO_2$, based on the pressure of $CO_2$ at the outlet of the supercritical fluid producing apparatus 70. Further, the pump 74 sends out the $CO_2$ based on the third supply rate $Q_3$. Desirably, the third supply rate $Q_3$ is lower than the second supply rate $Q_2$. Specifically, the controller 4 monitors the pressure measured by the outlet-side pressure gauge 97 and calculates a pressure increase rate per unit time. The controller 4 reduces the supply rate at which the $CO_2$ is sent out by the pump 74 to the third supply rate $Q_3$ based on the pressure increase rate. The controller 4 adjusts a stroke length $L_{s3}$ of the pump 74 based on the third supply rate $Q_3$, as in the pressure increasing process T1. The pump 74 sends out the $CO_2$ based on the third supply rate $Q_3$. Accordingly, it is possible to suppress the abnormal pressure increase within the circulation line 71f.

As described above, according to the present exemplary embodiment, in the pressure increasing process T1, the controller 4 determines the first supply rate $Q_1$ based on the target time t, during which the pressure increase is performed, the amount $W_{c1}$ of the processing fluid required for the pressure increase and the density $\rho_{p1}$ of the processing fluid at the inlet of the pump 74. The supercritical fluid producing apparatus 70 supplies the processing fluid to the processing container 301 based on the first supply rate $Q_1$. Accordingly, the inside of the processing container 301 becomes in the supercritical state in the target time t, during which the pressure increase is performed. As a result, it is possible to suppress the drying of the IPA present on the wafer W before the inside of the processing container 301 becomes in the supercritical state. Therefore, it is possible to suppress the collapse of the pattern on the wafer W.

Further, according to the present exemplary embodiment, the controller 4 adjusts the stroke length $L_{s1}$ of the pump 74 based on the first supply rate $Q_1$. Accordingly, it is possible to freely adjust the discharge flow rate of the pump 74. For this reason, it is possible to reduce the time required for the pressure increase and suppress the collapse of the pattern on the wafer W.

Furthermore, according to the present exemplary embodiment, in the circulating process T3, the controller 4 determines the second supply rate $Q_2$ based on the circulation time $t_v$ for circulating the processing fluid within the processing container 301, the amount $W_{c2}$ of the processing fluid required for the circulation and the density $\rho_{p2}$ of the processing fluid at the inlet of the pump 74. The supercritical fluid producing apparatus 70 supplies the processing fluid to the processing container 301 based on the second supply rate $Q_2$. Accordingly, the processing fluid within the processing container 301 can be circulated at the determined second supply rate $Q_2$, and thus, the IPA can be replaced with the $CO_2$ in the determined circulation time $t_v$ and amount of $CO_2$ consumption.

Moreover, according to the present exemplary embodiment, the controller 4 determines the third supply rate $Q_3$ at which the pump 74 sends out the processing fluid, based on the pressure of the processing fluid at the outlet of the supercritical fluid producing apparatus 70. The pump 74 sends out the processing fluid based on the third supply rate $Q_3$. Accordingly, it is possible to suppress the rapid increase in the pressure of $CO_2$ within the circulation line 71f and suppress the delay in the pressure control of the pressure control valve 76.

In the above-described exemplary embodiment, the controller 4 adjusts the stroke length $L_{s1}$, the stroke length $L_{s2}$ and the stroke length $L_{s3}$ of the pump 74 based on the first supply rate $Q_1$, the second supply rate $Q_2$ and the third supply rate $Q_3$, respectively. However, the present disclosure is not limited thereto. The controller 4 may adjust the number of strokes of the pump 74 based on the first supply rate $Q_1$, the second supply rate $Q_2$ and the third supply rate $Q_3$. In this case, the pump 74 capable of adjusting the number of strokes of the piston 74e (see FIG. 4A and FIG. 4B) (the number of movements of the piston 74e per unit time) is used. Further, the relationship between the number of strokes of the pump 74 and the amount of the processing fluid sent out from the pump 74 is obtained in advance. The controller 4 may set the number of strokes of the pump 74 based on the first supply rate $Q_1$, the second supply rate $Q_2$ and the third supply rate $Q_3$.

Furthermore, the controller 4 may adjust the flow rate of the processing fluid in the circulation line 71f based on the first supply rate $Q_1$, the second supply rate $Q_2$ and the third supply rate $Q_3$. In this case, the controller 4 is configured to adjust the flow rate of the processing fluid in the circulation line 71f by controlling the pressure control valve 76. Moreover, the relationship between the opening degree of the pressure control valve 76 and the amount of the processing fluid sent out from the pump 74 is obtained in advance. The controller 4 may adjust the opening degree of the pressure control valve 76 and set the flow rate of the processing fluid flowing in the circulation line 71f based on the first supply rate $Q_1$, the second supply rate $Q_2$ and the third supply rate $Q_3$.

Also, in the pressure increasing process T1, the controller 4 may adjust the flow rate of the processing fluid flowing in each of the orifices 55a and 55b based on the first supply rate $Q_1$. In this case, the controller 4 may be configured to adjust the flow rate of the processing fluid supplied into the processing container 301 by controlling the orifices 55a and 55b. Further, the relationship between the opening degree of the orifices 55a and 55b and the amount of the processing fluid supplied into the processing container 301 is obtained in advance. The controller 4 may adjust the opening degree of the orifices 55a and 55b to thereby set the flow rate of the processing fluid supplied into the processing container 301 based on the first supply rate $Q_1$.

The exemplary embodiments described herein are illustrative in all aspects and not limited thereto. The above-described exemplary embodiment may be omitted, substituted, or changed in various forms without departing from the scope and spirit of the appended claims.

For example, the processing fluid used for the drying processing may be a fluid other than the $CO_2$ (e.g., a fluorine-based fluid), or any fluid capable of removing the dry-suppressing liquid accumulated on the substrate in the supercritical state. In addition, the dry-suppressing liquid is not limited to the IPA and may be any liquid applicable as the dry-suppressing liquid. The substrate to be processed is not limited to the above-described semiconductor wafer W and may be a different substrate such as an LCD glass substrate or a ceramic substrate.

According to the exemplary embodiments, it is possible to suppress the collapse of the pattern on the wafer when the drying process is performed with the processing fluid in the supercritical state.

From the foregoing, it will be appreciated that various exemplary embodiments of the present disclosure have been described herein for the purposes of illustration, and that various modifications may be made without departing from the scope and spirit of the present disclosure. Accordingly, the various exemplary embodiments disclosed herein are not intended to be limiting, with the true scope and spirit being indicated by the following claims.

I claim:

1. A substrate processing apparatus, comprising:
a supercritical fluid producing apparatus including a pump configured to send out a processing fluid;
a processing container configured to perform a supercritical fluid processing on a substrate with the processing fluid in a supercritical state from the supercritical fluid producing apparatus; and
a controller configured to control at least the supercritical fluid producing apparatus,
wherein when a pressure increase is performed within the processing container by using the processing fluid, the controller determines a first supply rate at which the processing fluid is supplied to the processing container based on a target time during which the pressure increase is performed, an amount of the processing fluid required for the pressure increase and a density of the processing fluid, and
the supercritical fluid producing apparatus supplies the processing fluid to the processing container based on the first supply rate.

2. The substrate processing apparatus of claim 1, wherein the controller adjusts a stroke length of the pump based on the first supply rate.

3. The substrate processing apparatus of claim 1, wherein the controller adjusts a number of strokes of the pump based on the first supply rate.

4. The substrate processing apparatus of claim 1, wherein the supercritical fluid producing apparatus further includes a circulation line configured to return the processing fluid from a downstream side of the pump to an upstream side of the pump, and
the controller adjusts a flow rate of the processing fluid in the circulation line based on the first supply rate.

5. The substrate processing apparatus of claim 1, wherein an orifice configured to change a flow rate of the processing fluid with respect to the processing container is provided between the supercritical fluid producing apparatus and the processing container, and
the controller adjusts the orifice based on the first supply rate.

6. The substrate processing apparatus of claim 1, wherein the controller determines the first supply rate based on the target time during which the pressure increase is performed, the amount of the processing fluid required for the pressure increase and the density of the processing fluid at an inlet of the pump.

7. The substrate processing apparatus of claim 1, wherein when a circulation of the processing fluid within the processing container is performed, the controller determines a second supply rate at which the processing fluid is supplied to the processing container based on a circulation time during which the circulation of the processing fluid within the processing container is performed, an amount of the processing fluid required for the circulation and a density of the processing fluid at an inlet of the pump, and
the supercritical fluid producing apparatus supplies the processing fluid to the processing container based on the second supply rate.

8. The substrate processing apparatus of claim 7, wherein the first supply rate is higher than the second supply rate.

9. The substrate processing apparatus of claim 1, wherein when the processing fluid within the processing container is discharged, the controller determines a third supply rate at which the processing fluid is sent out from the pump based on a pressure of the processing fluid at an outlet of the supercritical fluid producing apparatus, and
the pump sends out the processing fluid based on the third supply rate.

10. A substrate processing method, comprising:
carrying a substrate into a processing container;
performing a pressure increase within the processing container with a processing fluid from a supercritical fluid producing apparatus including a pump configured to send out the processing fluid;
performing a circulation of the processing fluid by supplying the processing fluid to the processing container from the supercritical fluid producing apparatus and discharging the processing fluid from the processing container while maintaining a pressure at which the processing fluid within the processing container is kept in a supercritical state; and
discharging the processing fluid from the processing container to set a pressure within the processing container to be lower than at least a critical pressure of the processing fluid,
wherein, in the performing of the pressure increase,
using a controller to determine a first supply rate at which the processing fluid is supplied to the processing container based on a target time during which the pressure increase is performed, an amount of the processing fluid required for the pressure increase and a density of the processing fluid, and
the supercritical fluid producing apparatus supplies the processing fluid to the processing container based on the first supply rate.

11. The substrate processing method of claim 10, wherein, in the performing of the circulation of the processing fluid,
a second supply rate at which the processing fluid is supplied to the processing container is determined based on a circulation time during which the circulation of the processing fluid within the processing container is performed, an amount of the processing fluid required for the circulation and a density of the processing fluid at an inlet of the pump, and
the supercritical fluid producing apparatus supplies the processing fluid to the processing container based on the second supply rate.

12. The substrate processing method of claim 10, wherein, in the discharging of the processing fluid,
a third supply rate at which the processing fluid is sent out from the pump is determined based on a pressure of the processing fluid at an outlet of the supercritical fluid producing apparatus, and
the pump sends out the processing fluid based on the third supply rate.

13. The substrate processing method of claim 10, wherein the controller determines the first supply rate based on the target time during which the pressure increase is performed, the amount of the processing fluid required for the pressure increase and the density of the processing fluid at an inlet of the pump.

14. The substrate processing method of claim 13, wherein when a circulation of the processing fluid within the processing container is performed, the controller determines a second supply rate at which the processing fluid is supplied to the processing container based on a circulation time during which the circulation of the processing fluid within the processing container is performed, an amount of the processing fluid required for the circulation and a density of the processing fluid at an inlet of the pump, and the supercritical fluid producing apparatus supplies the processing fluid to the processing container based on the second supply rate.

15. The substrate processing method of claim 14,
wherein the first supply rate is higher than the second supply rate.

16. The substrate processing method of claim 15,
wherein when the processing fluid within the processing container is discharged, the controller determines a third supply rate at which the processing fluid is sent out from the pump based on a pressure of the processing fluid at an outlet of the supercritical fluid producing apparatus, and the pump sends out the processing fluid based on the third supply rate.

17. The substrate processing method of claim 11,
wherein, in the discharging of the processing fluid, a third supply rate at which the processing fluid is sent out from the pump is determined based on a pressure of the processing fluid at an outlet of the supercritical fluid producing apparatus, and the pump sends out the processing fluid based on the third supply rate.

* * * * *